(12) United States Patent
Dedene et al.

(10) Patent No.: US 7,176,861 B2
(45) Date of Patent: Feb. 13, 2007

(54) PIXEL STRUCTURE WITH OPTIMIZED SUBPIXEL SIZES FOR EMISSIVE DISPLAYS

(75) Inventors: Nele Dedene, Houthalen-Helchteren (BE); Robbie Thielemans, Nazareth (BE); Herbert Van Hille, Cambridge, MA (US); William E. Bird, Winksele (BE)

(73) Assignee: Barco N.V., Kortrijk (BE)

( * ) Notice: Subject to any disclaimer, the term of this patent is extended or adjusted under 35 U.S.C. 154(b) by 569 days.

(21) Appl. No.: 10/373,321

(22) Filed: Feb. 24, 2003

(65) Prior Publication Data

US 2004/0164935 A1    Aug. 26, 2004

(51) Int. Cl.
*G09G 3/32*    (2006.01)

(52) U.S. Cl. ......................................... 345/83; 345/904

(58) Field of Classification Search ................. 345/76, 345/77, 82–84, 904
See application file for complete search history.

(56) References Cited

U.S. PATENT DOCUMENTS

| | | | |
|---|---|---|---|
| 6,392,717 B1 * | 5/2002 | Kunzman | 348/744 |
| 6,639,574 B2 * | 10/2003 | Scheibe | 345/83 |
| 6,747,618 B2 * | 6/2004 | Arnold et al. | 345/77 |
| 6,911,961 B2 * | 6/2005 | Miller et al. | 345/82 |
| 2003/0043088 A1 * | 3/2003 | Booth et al. | 345/45 |
| 2004/0113875 A1 * | 6/2004 | Miller et al. | 345/82 |

\* cited by examiner

*Primary Examiner*—Richard Hjerpe
*Assistant Examiner*—Kevin M. Nguyen
(74) *Attorney, Agent, or Firm*—Barnes & ThornburgLLP

(57) ABSTRACT

A method of designing a fixed format emissive display is described using a computing device having a processor and a memory, the display comprising an array of emissive pixel elements, each pixel element comprising at least two sub-pixel elements made of different materials. The method comprises selecting areas of the at least two sub-pixel elements so that each pixel element displays white at a predetermined white point within a certain tolerance over a lifetime of the pixel, and such that the lifetimes of the sub-pixel areas are within a predetermined tolerance of each other.

A display having sub-pixel elements optimized so that each pixel element displays white at a predetermined white point within a certain tolerance over a lifetime of the pixel, and such that the lifetimes of the sub-pixel areas are within a predetermined tolerance of each other is also described.

23 Claims, 14 Drawing Sheets

PIXEL STRUCTURE WITH OPTIMIZED SUBPIXEL SIZES FOR EMISSIVE DISPLAYS

FIELD OF THE INVENTION

The present invention relates to emissive displays, especially fixed format emissive displays such as flat panel displays as well as methods of designing, manufacturing and operating them. The present invention also relates to computer software for executing design methods according to the present invention on a suitable computing platform.

TECHNICAL BACKGROUND

Electronic displays can use transmissive or emissive materials to generate pictures or light. Emissive materials are usually phosphorescent or electroluminescent materials. Examples are inorganic electroluminescent materials such as applied in thin film and thick film electroluminescent displays (EL-displays, for example thin film TFEL displays as manufactured by Sharp, Planar, LiteArray or iFire/Westaim). Another group is organic electroluminescent materials (such as Organic Light Emitting Diode OLED material) deposited in layers comprising small molecule or polymer technology or phosphorescent OLED, where the electroluminescent materials are doped with a phosphorescent material. Yet another group of materials are phosphors, commonly used in the well-established cathode ray tubes (CRT) or plasma displays (PDP) and even in emerging technologies like laser diode projection displays where the laser beam is used to excite a phosphor imbedded in a projection screen.

Two basic types of displays exist: fixed format displays which comprise a matrix or array of "cells" or "pixels" each producing or controlling light over a small area, and displays without such a fixed format, e.g. a CRT display. For fixed format, there is a relationship between a pixel of an image to be displayed and a cell of the display. Usually this is a one-to-one relationship. Each cell may be addressed and driven separately. Emissive, fixed format especially direct view displays such as Light Emitting Diode (LED), Field-Emission (FED), Plasma, EL and OLED displays have been used in situations where conventional CRT displays are too bulky and/or heavy and provide an alternative to non-emissive displays such as Liquid Crystal displays (LCD). Fixed format means that the displays comprise an array of light emitting cells or pixel structures that are individually addressable rather than using a scanning electron beam as in a CRT. Fixed format relates to pixelation of the display as well as to the fact that individual parts of the image signal are assigned to specific pixels in the display. Even in a color CRT, the phosphor triads of the screen do not represent pixels; there is neither a requirement nor a mechanism provided, to ensure that the samples in the image in any way align with these. The term "fixed format" is not related to whether the display is extendable, e.g. via tiling, to larger arrays. Fixed format displays may include assemblies of pixel arrays, e.g. they may be tiled displays and may comprise modules made up of tiled arrays which are themselves tiled into supermodules. Thus "fixed format" does not relate to the fixed size of the array but to the fact that the display has a set of addressable pixels in an array or in groups of arrays. Making very large fixed format displays as single units manufactured on a single substrate is difficult. To solve this problem, several display units or "tiles" may be located adjacent to each other to form a larger display, i.e. multiple display element arrays are physically arranged side-by-side so that they can be viewed as a single image. Transferring image data by packetized data transmission to the various display devices makes segregation of the displayed image into tiles relatively easy. At the junction of the tiles, usually some means to hide the join is applied. Such could be an opaque mask, as is for instance done in the case of tiled LCD displays, where the image of individual LCD panels is projected on a black matrix. To maintain a uniform appearance to the display, this mask is extended over the complete surface of the display and comprises an array of openings that coincide with the light emitting pixel structures of the display, or an array of openings that coincides with a group of light emitting pixel structures of the display (e.g. array of 4×4 pixels in one opening of the mask). OLED displays provide certain advantages for tiled displays such as light-weight, ease of manufacture, wide angle of view, and the ability to use back-connectors which allows close tiling with the smallest joint between tiles.

When making color displays, the colors are obtained through mixing light from primary colors such as but not limited to red, green and blue. For fixed format, emissive displays separate or stacked individual "primary" emitter layers generate these colors. If the primary emitter layers are applied next to each other and usually close to each other, then from a certain minimum distance onwards (compounding distance), the observer is not able to distinguish the primary emitters but sees only one resulting color. Most color displays are bi-color or full color referring to respectively two primaries or at least three primary emitters per pixel.

In order to be able to generate as many colors possible, including white, at least three primary emitters are required with the emitted wavelengths of each as close as possible to pure colors such as pure red, pure green and pure blue, for example. The theory of color perception is well known, for example from the book "Display Interfaces", R. L. Myers, Wiley, 2002. Primaries exist as mathematical constructs only and then lie outside the range of real-world colors. A more useful color space and color co-ordinate system has been standardized, e.g. the CIE chromaticity diagram. Typically in fixed format displays red, green and blue pixel elements are used, typically called RGB pixel elements. For ease of production, the area sizes of the three color emitters, i.e. the RGB pixel elements, are made equal. A CIE chromaticity diagram with the locations thereon of typical OLED and LED materials is shown in FIG. 1. The locations on this diagram are shown for a typical OLED display: red, RO; green, GO and blue, BO as well as for an LED display: red, RL; green, GL; blue, BL.

Materials used to form a pixel element have a certain light output, which increases with increased delivered electrical charge per time unit and per area unit. This is sometimes called an L–J characteristic, light output (Nit or $cd/m^2$) versus current density ($mA/cm^2$). FIG. 2 shows such a curve for a green OLED material. Each unit of charge is trapped for a short time and then released with reduced energy, the difference being emitted as photon(s). This characteristic is unique for the relevant material. The characteristic can be described by an analytical function quite accurately—see FIG. 2. Another characteristic is the change of light output over time at a given current density. Some materials age with the accumulated amount of trapped charge over time. In addition, this is also a unique characteristic or property of the material (See FIG. 14).

Finally, emitters for fixed format displays have a certain emissive spectrum. Each material has a different dominant wavelength as well. This determines unambiguously what colors can be generated with a pixel.

LG electronics, Korea has disclosed (SID 2002, International Symposium Digest of Technical Papers, p. 1178–1181) a display panel with a 4-emitter pixel, of which two are red. The article clearly states that this is for compensating brightness (luminous efficiency), not lifetime and the areas of all four emitters are the same.

Similar 'superpixels' can be found in the LED display industry. However, in this case the target is to merely match the luminous efficiency and not the lifetime, as in all circumstance the LED outlives other components such as power supplies or cooling fans.

The usual trend in the industry is to use equal size emitters for displays and to develop improvements of the weakest material. The reason for this is optimization of various spin coating, shadow masking or other deposition processes. This inherently leads to non-optimized use of materials in the display.

In particular, OLED's are used for small handheld devices such as mobile or cellular phones, smart phones, super phones, PDA's, etc. These devices need to be read in a variety of incident light intensities. However, the battery power consumption needs to be kept with certain limits over the complete lifetime of the product in order to avoid user dissatisfaction.

SUMMARY OF THE INVENTION

Specifically for those emitter technologies where the technology is not able to deliver superior lifetime, there is a need to create a display with a longer lifetime than conventional pixel arrangements.

Accordingly, the present invention provides a fixed format emissive display comprising: an array of emissive pixel elements, each pixel element comprising at least two sub-pixel elements made of different materials; and areas of the at least two sub-pixel elements being such that lifetimes of the sub-pixel areas are within a predetermined tolerance of each other. By adapting the areas to provide a uniform lifetime and efficient use of materials is obtained. Each pixel element preferably displays white at a predetermined white point within a certain tolerance over a lifetime of the pixel element. Particularly when used as a tile in a larger display it is important that each tile provides a similar white. The lifetime of the pixel element can be determined by the brightness of the pixel element reducing to a predetermined value compared with an initial value, preferably within the range 40–60%. The lifetime of the pixel element can also be determined by a color shift of the pixel element greater than a predetermined value. Also, the lifetime of a sub-pixel element can be determined by the brightness of the sub-pixel element reducing to a predetermined value compared with an initial value, preferably within the range 40–60%. Also, the lifetime of a sub-pixel element can be determined by a color shift of the sub-pixel element greater than a predetermined value. This predetermined value can be a number of JND's, e.g. 3. Usually, there will be least three sub-pixels for each pixel element and areas of the at least three sub-pixel elements are such that the lifetimes of the sub-pixel areas are within a predetermined tolerance of each other. This predetermined tolerance can be 20%, more preferably 10%. The pixel elements may be made of a variety of materials of which organic light emitting diodes are particularly preferred.

The present invention also provides a design environment for designing a fixed format emissive display, the display comprising an array of emissive pixel elements, each pixel element comprising at least two sub-pixel elements made of different materials. The design may be performed using a computing device having a processor and a memory. The design method comprises selecting areas of the at least two sub-pixel elements so that each pixel element displays white at a predetermined white point within a certain tolerance, and modifying the areas of the at least two sub-pixel elements to optimize a lifetime of one or more elements of the display. The display elements to be optimized are the sub-pixel elements and the lifetimes of the sub-pixel elements are optimized to within a predetermined tolerance of each other. The predetermined tolerance may be 20%, more preferably 10%. When the display elements to be optimized are the sub-pixel elements, the sub-pixel areas may be optimized so that each pixel element displays white at a predetermined white point within a certain tolerance over the lifetime of the pixel element. The lifetime of the pixel element may be determined by the estimated brightness of the pixel element reducing to a predetermined value compared with an initial value, preferably within the range 40–60%. Also, the lifetime of the pixel element may be determined by an estimated color shift of the pixel element greater than a predetermined value. The lifetime of a sub-pixel element may be determined by the estimated brightness of the sub-pixel element reducing to a predetermined value compared with an initial value, preferably within the range 40–60%. The lifetime of a sub-pixel element may be determined by an estimated color shift of the sub-pixel element greater than a predetermined value, the predetermined value being a number of JND's, e.g. 3. The method may include calculation of a temperature of each sub-pixel element when each pixel element displays white at the predetermined white point, and calculating an aging effect on each sub-pixel element based on the calculated temperature. When the display is powered by a battery, the display element to be optimized may be the battery, wherein the sub-pixel areas are optimized to optimize an estimated battery lifetime between charging over the lifetime of the pixel elements.

In a further aspect the present invention provides a computer program product for carrying out any of the methods of the present invention when the computer program product is executed on a computing device. In particular, the computer program product has code segments for selecting areas of at least two sub-pixel elements of a display and modifying the areas of the at least two sub-pixel elements to optimize a lifetime of one or more elements of the display. Preferably, the computer product comprises code, when executed, which can determine the sub-pixel areas such that that each pixel element displays white at a predetermined white point within a certain tolerance. When the code is executed, the lifetimes of the sub-pixel elements may be optimized to within a predetermined tolerance of each other. Preferably the code, when executed, optimizes the sub-pixel areas so that each pixel element displays white at a predetermined white point within a certain tolerance over the lifetime of the pixel element. Preferably the code, when executed, determines the lifetime of the pixel element by the estimated brightness of the pixel element reducing to a predetermined value, e.g. in the range 40–60% of its initial value. The code, when executed can determine the lifetime of the pixel element by an estimated color shift of the pixel element greater than a predetermined value. The code, when executed, can determine the lifetime of a sub-pixel element by the estimated brightness of the sub-pixel element reducing to a predetermined value such as within a range 40–60% or 50% of its initial value. The code, when executed, can determine the lifetime of a sub-pixel element by an estimated color shift of the sub-pixel element greater than a predetermined value. Preferably, the predetermined value is a number of JND's, e.g. 3. Typically, there are at least three sub-pixels for each pixel element and the code, when executed, optimizes areas of the at least three sub-pixel elements such that the lifetimes of the sub-pixel areas are within a predetermined tolerance of each other. This predetermined tolerance may be 20%, more preferably 10%. The code when executed may consume data relating to the display, in particular performance data for pixel elements which are organic light emitting diodes. The code, when executed can calculate a temperature of each sub-pixel element when each pixel element displays white at the predetermined white point, and can calculate an aging effect on each sub-pixel element based on the calculated temperature. When the display is powered by a battery, the display element to be optimized may be the battery, and the code, when executed, may optimize the sub-pixel areas to optimize the battery lifetime between charging over the lifetime of the pixel elements.

The computer program product can reside in computer storage, e.g. in a computer volatile or non-volatile memory. The computer program product may be capable of being distributed as a program product in a variety of forms, e.g. stored on a signal bearing media. Examples of computer readable signal bearing media include: recordable type media such as floppy disks and CD ROMs and transmission type media such as digital and analogue communication links.

The present invention will now be described with reference to the following drawings.

DESCRIPTION OF THE ILLUSTRATIVE EMBODIMENTS

The present invention will be described with reference to certain embodiments and drawings but the present invention is not limited thereto. The skilled person will appreciate that the present invention has wide application with displays. The present invention will mainly be described with reference to OLED materials, however it may find advantageous use with a wide variety of emissive materials (both luminescent and phosphorescent materials).

In the following an emissive pixel structure refers to an emissive, fixed format pixel which may comprise a number of pixel elements, e.g. red, green and blue pixel elements. Each color element may itself be made up of one or more sub-elements. Hence, a pixel structure may comprise sub-pixel elements. A pixel structure may be monochromatic or colored. Further, the array may be a passive or active matrix.

Figure 1:
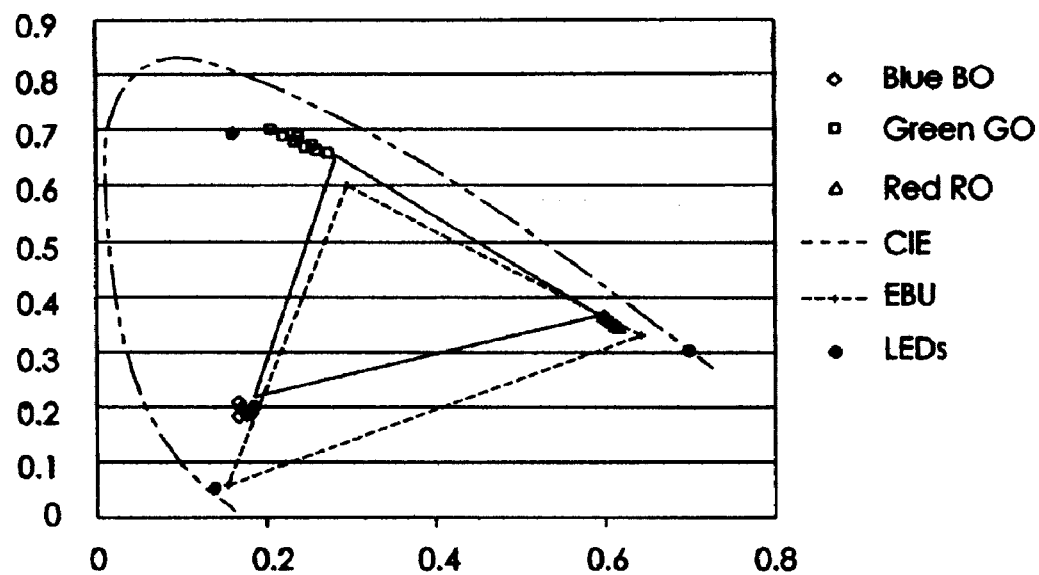
FIG. 1 shows a CIE diagram, European Broadcasting Standard and the color output of certain LED and OLED materials.
Figure 2:
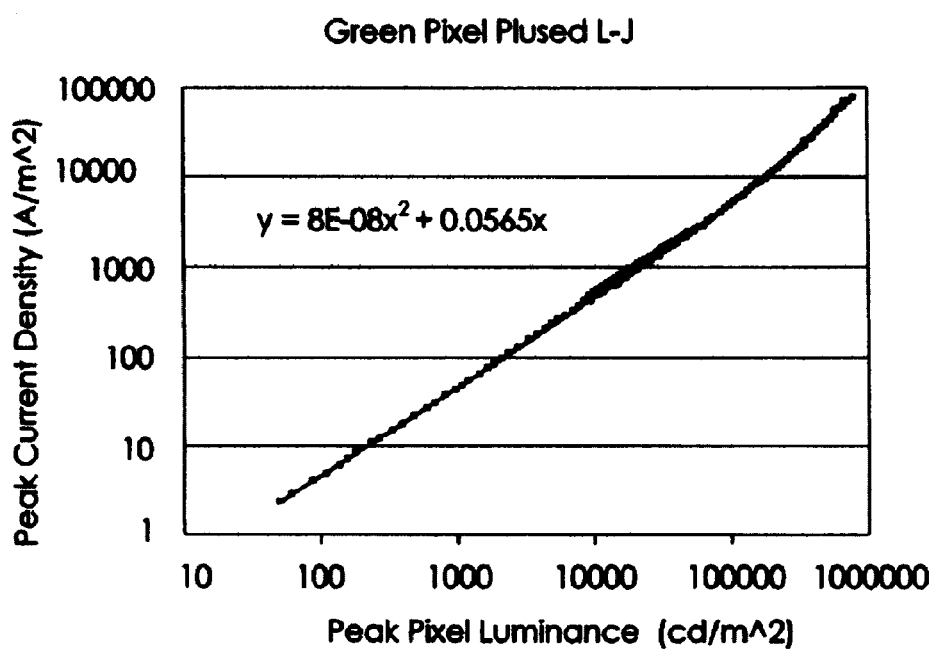
FIG. 2 shows an L–J characteristic for a Green OLED material. The graph shows experimental data and a curve fitted to the results suitable for inclusion in a model.
Figure 3A:
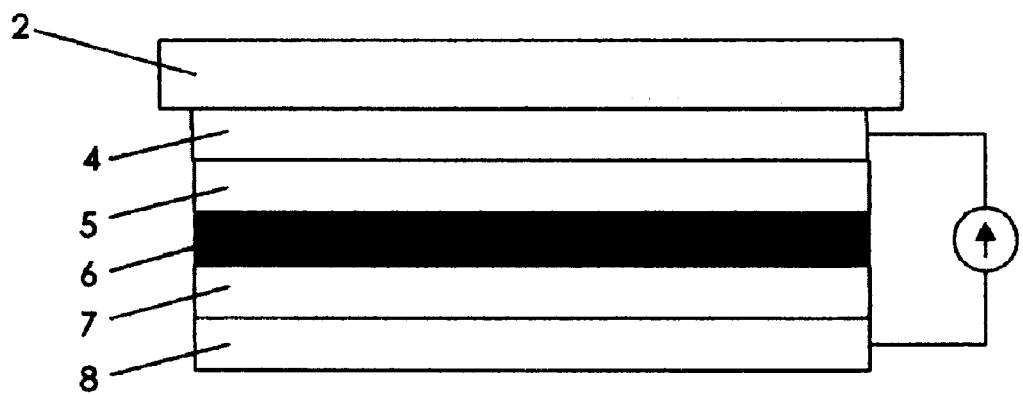
FIG. 3A shows a cross-section through the layers of a conventional OLED pixel structure.

A known method of manufacture of OLED displays which may be used with the present invention results in a pixel structure as shown schematically in FIG. 3A with a transparent substrate 2, usually a glass substrate, being closest to the viewer and facing in the display direction. Behind this substrate a series of layers 4–8 are deposited, e.g. at least a first transparent electrode 4, the organic light emitting element 6 and a second electrode 8. An organic light emitting material is deposited for each color in each pixel structure, e.g. three color elements 6, red, green and blue, for each pixel structure. Thus, each pixel structure can emit white light or any color by controlling the light energy emitted from each color element of a pixel structure. Usually additional layers are deposited such as electron and hole transport layers 7, 5 (see FIG. 3A that has been adapted from FIG. 4–13 of "Display Interfaces", R. L. Myers, Wiley, 2002).

The present invention will also mainly be described with reference to depositing light emitting elements onto a transparent substrate. However, the present invention includes deposition onto other substrates, e.g. opaque or translucent substrates. The opaque substrate may be a ceramic material for example. The arrangement as shown schematically in FIG. 3A may be applied to an opaque substrate 2, being furthest from the viewer and facing away from the display direction. In front of this substrate a series of layers 4–8 are deposited, e.g. at least a first electrode 4, the organic light emitting element 6 and a second transparent electrode 8. An organic LED material is deposited for each color in each pixel structure, e.g. a plurality of color elements 6, red, green and blue, for each pixel structure, whereby there may be more than one color element for each primary color. Each pixel structure can emit white light or any color by controlling the light energy emitted from each color element of a pixel structure. Usually additional layers are deposited such as electron and hole transport layers 5, 7. On tops of these elements a transparent encapsulating or sealing layer may be applied, deposited or fixed (not shown in FIG. 3A).

Figure 3B:
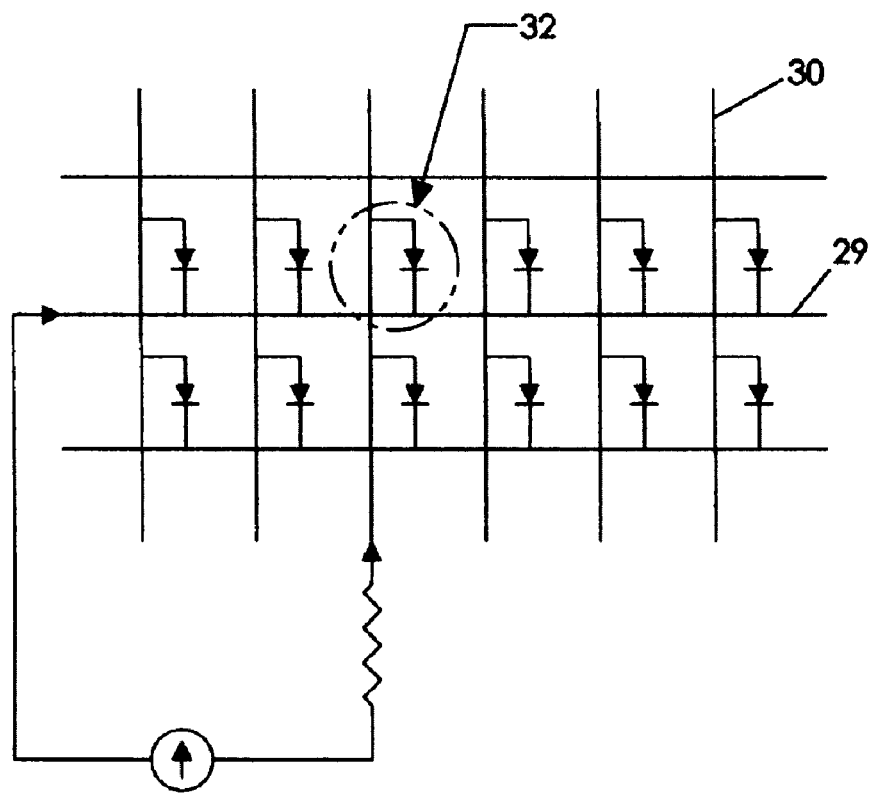
FIG. 3B a schematic representation of a Cartesian pixel structure array that can be used with the present invention.

In FIG. 3B a schematic fixed format display is shown which can be used with the present invention comprising an array of pixel structures which are addressed in logical rows and columns by means of row and column lines 29, 30 respectively. The display may be a tile of a larger tiled display. For example, the display may be a tile of a module which, when mounted with other modules forms a larger tiled array. It is understood that in the case of an OLED array, the lines 29 and 30 contact respective sides of layers of deposited organic material. By "logical rows and columns" is meant that each pixel structure can be addressed by applying electrical current to both a row line and a column line which cross at a pixel structure 32 to be addressed. However, the actual array of pixel structures need not be in rows and columns, it can be polar, for instance, i.e. radial and circumferential addressing. The word "logical" in the expression "logical rows and columns" means that the method of addressing is as if there were rows and columns of pixel structures but that the physical arrangement of pixel structures could be a different one. Hence, "logical rows and columns" relates to the topology and not necessarily the topography.

In order to address each one of the pixel structures individually it is necessary to provide both cathode and anode electrode strips 29 or 30 which contact opposite sides of the organic material that emits the light in each color element of a pixel structure. Ideally, the arrangement of electrodes should be such that standard manufacturing techniques can be used, e.g. those developed for manufacture of semiconductor devices and other forms of displays such as Liquid Crystal Displays (LCD). Typical for these techniques is multilayer patterning using photoresists. General methods of lithographic patterning using photoresists may be found in the book entitled: "Microlithography" by J. R. Sheats and B. W. Smith, Marcel Dekker, 1998. General methods of deposition and etching of materials may be found in the book "The Science and Engineering of Microelectronics Fabrication", S. A. Campbell, Oxford, 2001.

Figure 3C:
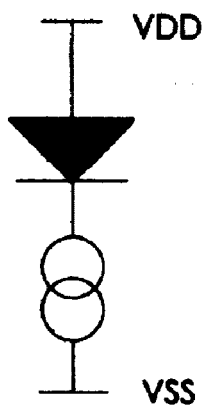
FIG. 3C shows a schematic electrical representation of an OLED light emitting element.

FIG. 3C is a schematic representation of a light emitting OLED. The OLED itself can be modeled as a diode having a significant capacitance. It is located between voltage sources VDD and VSS. A common anode or common cathode arrangement may be used. A current source injects (or sinks) current into the diode to cause light emission. By changing the current with time it is possible to compensate for degradation of the OLED material. As degradation occurs more current may be needed to provide the same level of brightness. Thus, by increasing the current for a given desired brightness, this degradation can be compensated. However, this compensation has disadvantages. The increased current causes increased heat output and therefore a rise in temperature. This rise in temperature causes degradation of the organic material of the OLED to degrade faster. Also the increased charge passed through the OLED causes increased degradation of the OLED material. Also, for battery powered devices, the increased current load increases the frequency of battery charging.

Figure 4:
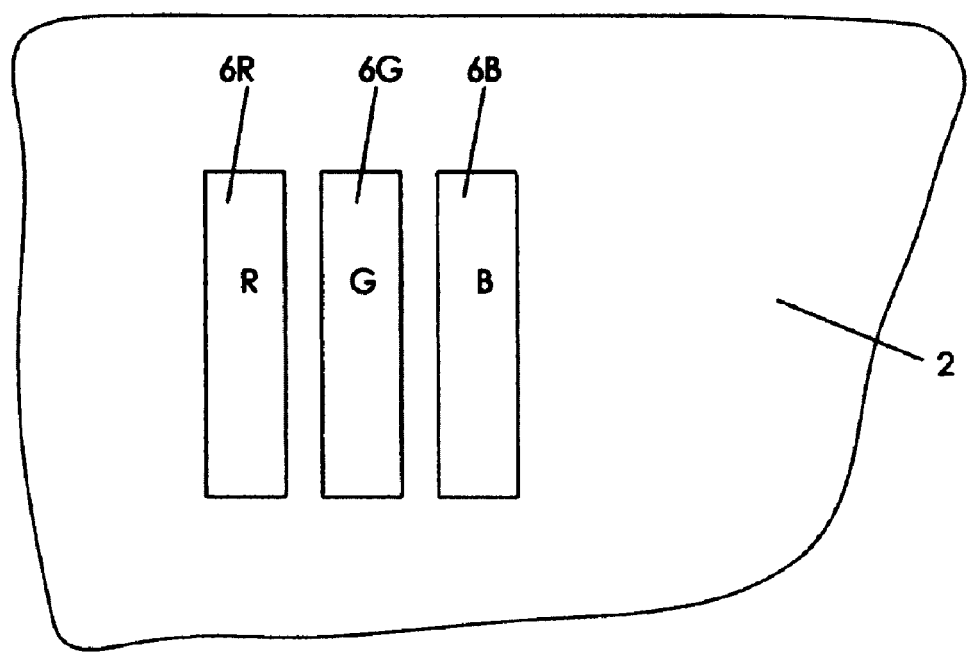
FIG. 4 shows a top view of the color elements of a conventional OLED multi-color pixel structure.

The conventional color elements 6R, 6G, 6B of one pixel structure of an OLED which may be used with the present invention are shown in FIG. 4 deposited onto a substrate 2—the electrodes and other layers are not shown. The color elements 6R, 6G, 6B are arranged in parallel, rectangular strips.

If three such equally sized OLED emitter elements are arranged in a pixel structure resulting in a certain emission spectrum, a full white at a certain white luminosity output can be obtained provided three different light outputs are produced from the individual emitters resulting in different current densities. Each current density is associated with a certain lifetime. One endpoint of lifetime of a pixel may be defined as the time it takes until the pixel delivers a light output of half the initial value. Another endpoint for lifetime is when the change of light output of one sub-pixel color element is sufficient so that there is a color shift in the light output from the pixel which can be detected by the human eye. For reproducible test purposes the lifetime is usually determined at constant current density. If all the emitters are the same size, at least one of the emitters will operate at less or more favorable conditions than the others and thus age sooner or later, respectively. The required current density in one of the emitters may even be so high that the lifetime is limited to days.

Also for a pixel structure with equally sized R/G/B emitters, the maximum possible light output in white depends on the maximum light output which one color emitter can emit. Thus, the weakest emitter determines the maximum white output.

As a conclusion, it is not favorable to maintain equal sizes for the individual emitters.

Specifically for OLED displays, where the material technology for making emitters is in its early stage, the above mentioned problems are serious issues: the limited light outputs possible with the existing emitter materials result in an overall light output of an OLED display which is too low for many applications. A straightforward solution is to operate the pixel at high current densities, but this will seriously impact the lifetime.

Clearly there is a need to design a solution for solving at least one of and preferably both of two problems:
a) Maximizing light output or reducing the size of each pixel for a given output which are equivalent to each other,
b) Maximizing the lifetime of a pixel. A pixel is no longer useful when one of its sub-pixel emitters is outside specified guaranteed values. If one sub-pixel provides less than the required output then there is a color shift for each color displayed.

Figure 5A:
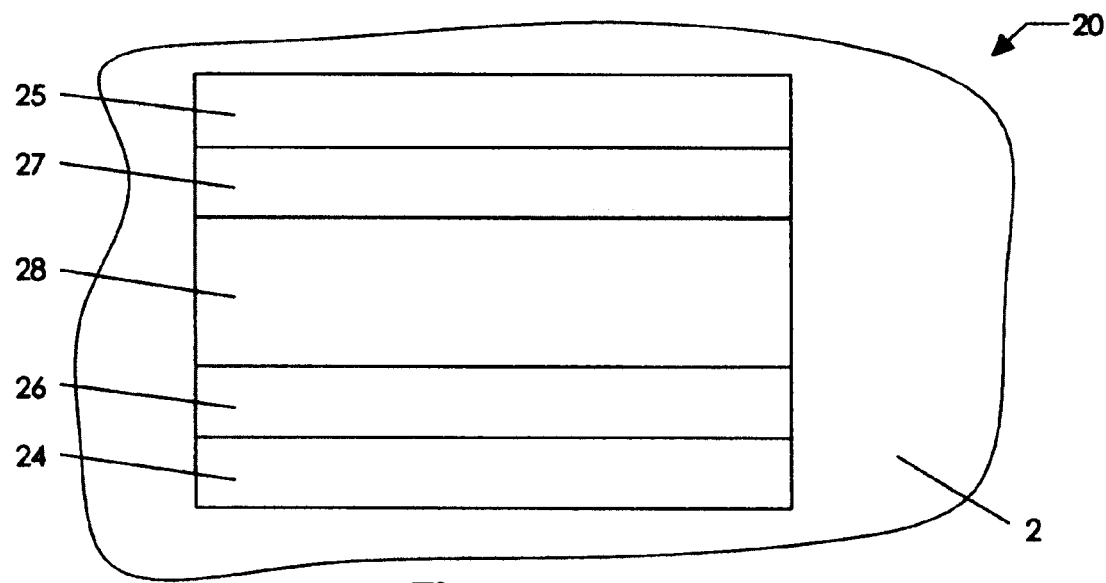
FIGS. 5a to e show schematic representations of alternative pixel structure designs with different sub-pixel areas optimized in accordance with embodiments of the present invention.
Figure 5B:
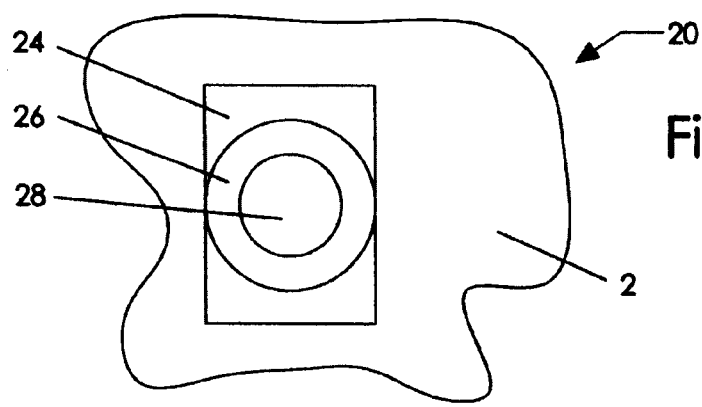
Figure 5C:
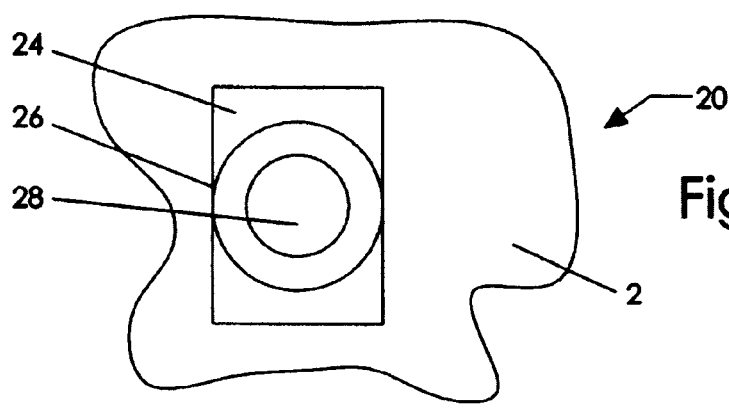
Figure 5D:
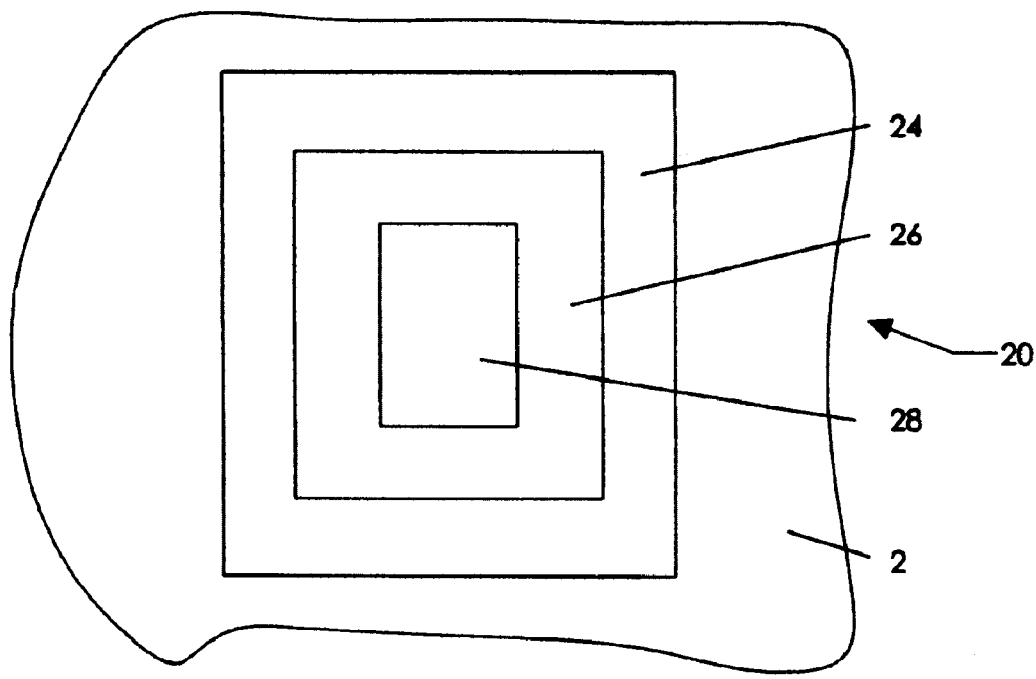
Figure 5E:
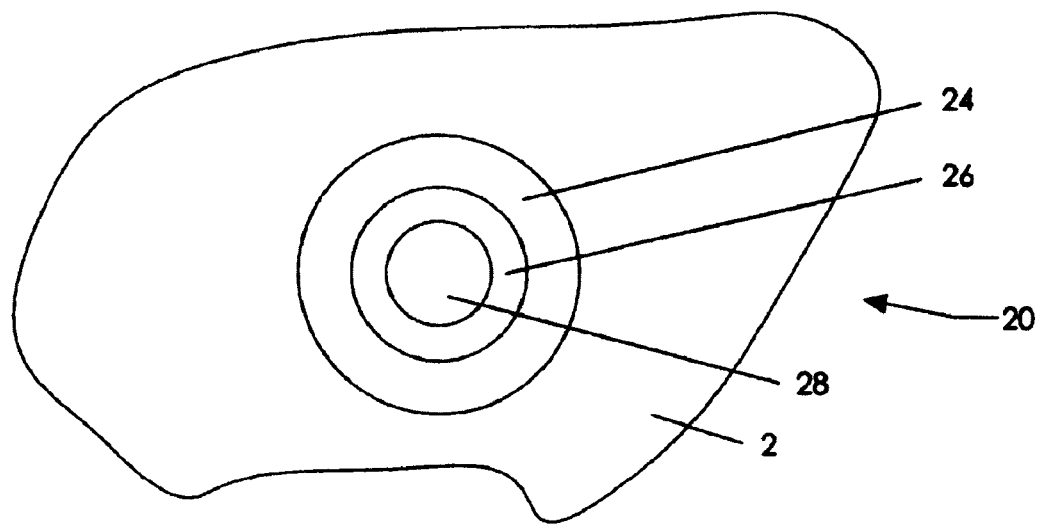

In accordance with the present invention a solution to at least one of the above problems is to adapt the sizes of the primary emitters to obtain a maximum light output and, preferably, at the same time operate them at individual conditions which allow substantially equal lifetimes. As shown in FIGS. 5a to e, the sizes of color pixel elements 24–28, i.e. the sub-pixel elements, are of different sizes to optimize light output and lifetime of a pixel structure. In each of these pixel structures 20, layers of OLED material are deposited onto a substrate 2. For each primary color, one or more sub-pixel elements are provided, e.g. in FIG. 5a, a first primary with sub-elements 24, 25, a second primary with sub-elements 26, 27 and a third primary with sub-element 28. In FIGS. 5b, c, d and e, there are three primary color sub-pixels 24, 26, 28. The primaries may be red, green and blue. The methods according to the present invention optimize the areas of the red, green and blue pixel elements, 24–28 (FIG. 5) so that each of the pixel elements has substantially the same lifetime and a total pixel area is optimized to provide a desired brightness while maintaining a desired white point or color temperature.

Before optimization of the sub-pixel sizes is possible, it is necessary to decide on the requirements of the display, e.g. White point definition, Minimum required life time, Target brightness at full white, Temperature range of operation, Pitch of the pixels in the display (or resolution and display size), Fill factor (determines the maximum area available to construct the pixel). The definition of fill factor, is the proportion of the practically available area for a pixel (after reduction of process parameters and addressing lines) and the theoretical maximum available area for a pixel (product of the horizontal and the vertical pitch).

For a first level optimization, e.g. for brightness, it is necessary to calculate the contributions of each color from the color emitters to the white point. For this a set of data is required, namely the spectral distribution of light emitted from each color element at estimated current densities. This data can be obtained by preparing so-called test pixel structures and measuring them with a spectroscope.

It is then necessary to decide for each color pixel element the minimum-required surface area in order to reach the desired brightness. Most brightness characteristics show saturation as current density increases. Therefore, it is necessary to operate below or close to the saturation point in order to minimize the required emitter size.

For a second level optimization, e.g. lifetime, it is necessary for each of the primaries to estimate the lifetime from the required current densities which result from the first optimization. Then, the area of the longest living emitter is maintained unchanged while the size of the other primaries is increased until their lifetime matches the first one. The match does not need to be perfect. Humans experience color in such a way that spectral differences, if small enough, are not perceived. The degree of mismatch of colors has been investigated thoroughly and areas of the CIE chromatacity diagram which appear the same color to most subjects are described as color ovals or MacAdam ellipses—see FIG. 7. If color differences are within the MacAdam ellipses, their differences are said to be less than 1 JND ("Just Noticeable Difference"), and the display is visibly perfect. However, really noticeable differences such as to disturb an average viewer can be higher than 1 JND. The degree of color shift may be measured in JND's or in other units such as "minimum perceptible color differences", MPCD. The endpoint for a pixel may be defined as a certain number (e.g. one or more) of JND or MPCD above or below the specified color. For example, to determine an end of life based on JND's, one can say that the display becomes non-acceptable for commercial use when color differences are more than a certain number of JND's, e.g. 3 JND's. Thus, one end point of the useful life of a pixel can be related to when one or more of its sub-pixel elements has changed its output such that the light output of the complete pixel structure compared to the specified output differs by an amount which lies outside a relevant tolerance, such as outside the relevant MacAdam ellipse for the color to be displayed. This is a plausible idea if one does not consider color correction in the display during its lifetime and color shift is the end of life criterion.

However, most of the time and to simplify the measurement, end of life is specified when the light output from the complete pixel structure has dropped below a certain percentage of its specified value, e.g. 50% of its initial value or some other such percentage, e.g. within the range 40–60%. For test purposes, the half initial light output criterion may be measured while keeping the current densities constant. This point may sometimes be called (or is related to) MTBF (Mean Time Between Failures), because once half the brightness is reached, pixels will probably cease to function in a general way, as opposed to occasional failures before that time. In this case there is a noticeable color shift. Hence, after this time the quality of the display is so degraded that it is no longer suitable for its application. Color shifts which occur after this endpoint can be ignored.

If the three sub-pixel emitter areas so determined exceed the available area for the pixel in the display design (depending on the fill factor and pitch), then areas have to be reduced while maintaining relative proportions. If the total area is less than the available area a third optimization is possible. The brightness can be increased by increasing the area (while maintaining the relative proportions of each color) while maintaining current densities the same or the target brightness can be kept and the current densities reduced by increasing the areas (while maintaining the relative proportions of each color) until the fill factor is a maximum.

Present materials such as used for OLED displays still show wide variations and significant reductions in light output with aging. Thus, it is not obvious how to divide the available pixel area while maximizing brightness and making the lifetime for the primary emitters to be equal. This requires a trade-off to be made between the brightness and the lifetime of the display which the present invention addresses.

In accordance with an embodiment of the present invention a method of calculation of the sizes of the color elements of a pixel structure is provided. The lifetime of each color element of a pixel structure is dependent upon its current density and its temperature. However, its temperature is also dependent upon its current density due to resistive heating. Also its brightness is dependent upon the current density and also its area. To obtain a desired white point, each of the color pixel elements must emit a certain brightness with respect to each other. For a particular design, the properties of half-life, current density, area of each pixel element and environmental temperature are all related to each other when the white point has been chosen.

Each color can be described by its tristimulus values X, Y, Z in the CIE color space. Only the Y value represents contributions to the brightness perception of the human eye it is called brightness or luminance and a color can also be described by Y and the color functions x, y, z Given the design white point and brightness (such as 500 Nit, 6500K white, e.g. D65) and the color coordinates of the primary emitters ($x_i$, $y_i$), the individually required brightness $Y_i$ can be calculated from the equation 1.

$$\begin{pmatrix} X_{D65} \\ Y_{D65} \\ Z_{D65} \end{pmatrix} = Y_{D65} \begin{pmatrix} \frac{x_{D65}}{y_{D65}} \\ 1 \\ \frac{1 - x_{D65} - y_{D65}}{y_{D65}} \end{pmatrix} = \sum_{i=R,G,B} Y_i \begin{pmatrix} \frac{x_i}{y_i} \\ 1 \\ \frac{1 - x_i - y_i}{y_i} \end{pmatrix} \quad (1)$$

With these brightness values and the L-I-V data for the emitter materials or by the use of the formulas below, it is possible to determine current densities and the resulting temperatures and lifetimes. By keeping the area of each emitter as a variable one can iterate until the required lifetime is reached or simply solve the following equations for area or any other set of equations, which adequately reflect the characteristics of the emitter near the operation conditions of the display.

For instance, for some materials, the I–V characteristics varies around a known test point, for instance measured at 10 mA, as described below in accordance with the trapped charged limited conduction equation 2:

$$J = J_{10\,mA}\left(\frac{V}{V_{10\,mA}}\right)^n \quad (2)$$

Figure 6:
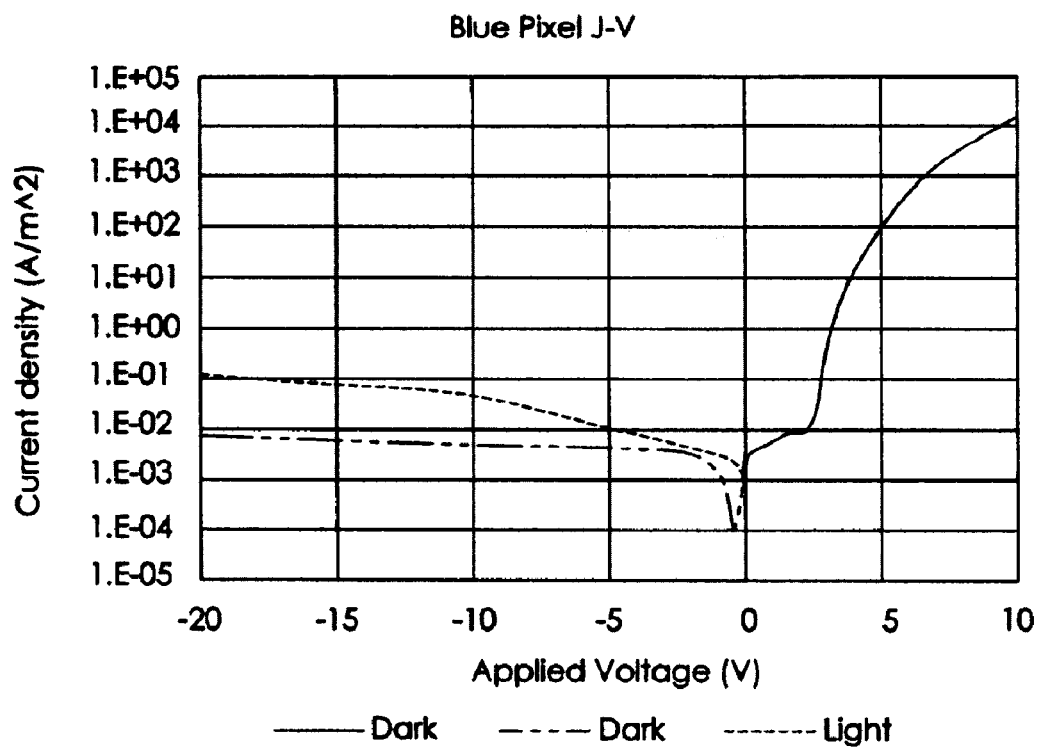
FIG. 6 shows a J-V characteristic for a blue OLED material
Figure 7:
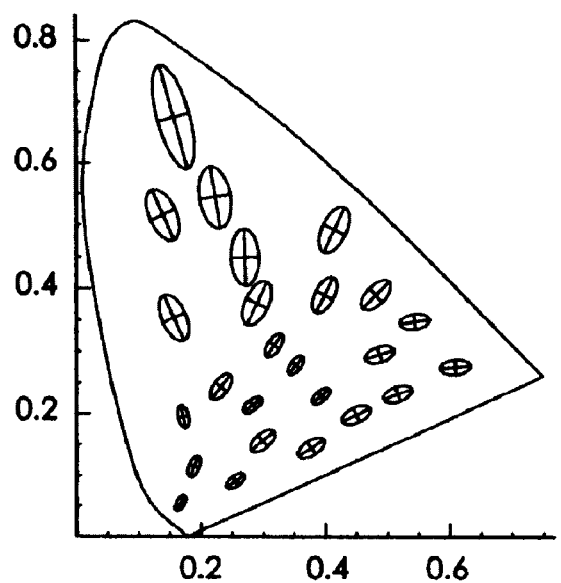
FIG. 7 shows a diagram demonstrating McAdam ellipses.

(J is the current density, V the imposed voltage across the emitter). Exponent n is an integer chosen such that the I–V characteristic is matched sufficiently well with measured values. If desired, one can however choose to use actual measured values themselves independent of a simplifying formula, e.g. more accurate measured data over a range of current densities and voltages. The form of an I–V curve for a blue OLED material is shown in FIG. 6 as an example.

The L–J characteristic may either be taken from extensive measured data or modeled as a first or second order polynomial, such as equation 3. When using a second order polynomial saturation effects may be modeled. Saturation is a phenomenon exhibited by a lot of materials at higher currents.

$$J = k_1 L + k_2 L^2 \quad (3)$$

(J is the current density in the emitter, L the luminance, thus the k1-factor being the inverse of luminous efficiency)

The first lifetime endpoint can be calculated by an Arrhenius equation which relates the temperature of the emitter to its operating life:

$$Q(T) = Q(298) \times e^{\left(T_{decay}\left(\frac{1}{T} - \frac{1}{298}\right)\right)} \quad (4)$$

(Q(T) is the total charge at which the luminous efficiency decays to ½ of its original value at a certain temperature T in K, and $T_{decay}$ is the decay temperature characterizing the decrease of lifetime at an activation energy of 0.6 eV).

For the calculation of whether the light output from a complete pixel lies within the MacAdam ellipses despite individual sub-pixels not providing the optimum amount of light, it is necessary to know the light output of each pixel sub-element with time. They follow from applying the equation (3) to all emitters. Then the light outputs of all the sub-pixel elements at a series of current densities are combined with their spectral response to provide a measure of the color shift at each current density according to an equation such as:

$$\Delta E^*_{uv} = \sqrt{(L_1^* - L_2^*)^2 + (u_1^* - u_2^*)^2 + (v_1^* - v_2^*)^2} \quad (5)$$

where the color output of the pixel is $L_2^*$, $u_2^*$, $v_2^*$ in L*u*v* space and the required color is $L_1^*$, $u_1^*$, $v_1^*$. For derivation and application of this equation see the book by Myers mentioned above.

Other experimentally or theoretically derived equations, which express the lifetime of an emitter material as a function of current density and temperature can be used. It is part of the know-how of a display developer to use the equations which give the most reliable fit to the reality of his particular product.

The above equations 2–5 can be solved once actual values are placed in the equations for each color pixel material and the lifetime of each pixel color element may the same as the others.

The temperature, which is experienced by a pixel element depends upon the power density in the emitting element and the thermal characteristics of the display, which can be modeled in many ways. Numerical analysis is well known to the skilled person, e.g. "Numerical Analysis", Burden and Faires, Brooks/Cole, 2001 and is particularly useful for the solution of thermal problems. A physical model of the display as a mesh of nodes is input into a computer and information defining heat sources and sinks, as well as thermal conductivities, reflectivities and convective properties of materials. This physical model is then solved using numerical analysis or any other suitable analytic method to determine the temperature of each pixel element. These temperatures are then fed back into the lifetime equations given above and the new lifetimes of each pixel element calculated. If the design lifetime or lifetime equality between pixel elements is not obtained, the size of each pixel element can be altered to thereby reduce the current density and the heating effect. Alternatively, the thermal environment of the display may be improved, for example by providing forced cooling. Methods of forced cooling of flat panel displays are disclosed in co-pending European patent application "Light Emission Display Arrangements" having the filing number EP0279208 which is incorporated herein by reference. Although the above method uses finite element analysis the present invention is not limited thereto but may include other methods, e.g. representing a thermal model of the display by a polynomial approximation or by other mathematical functions.

Figure 8:
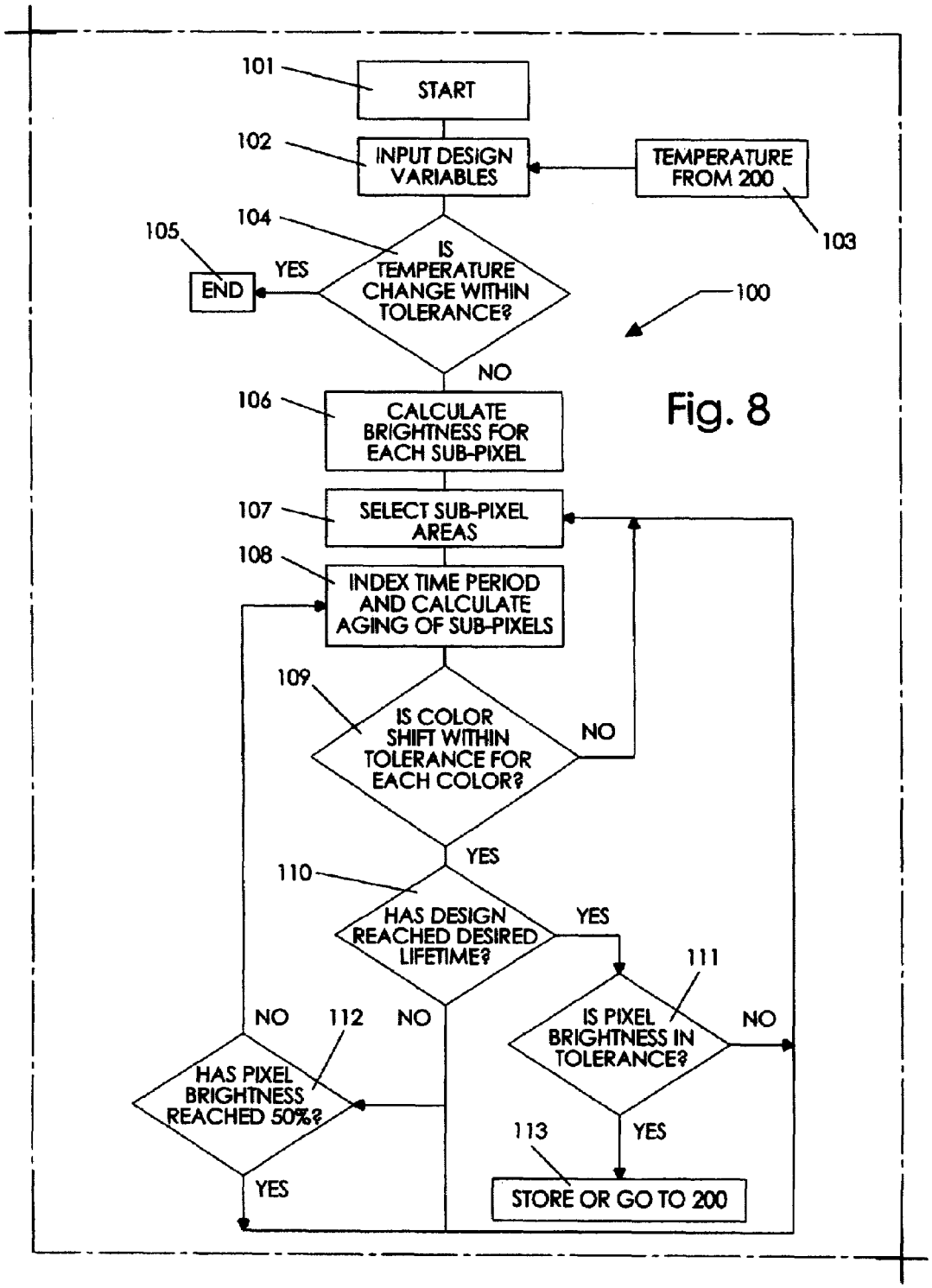
FIG. 8 shows a flow diagram of part of an optimization procedure in accordance with an embodiment of the present invention.
Figure 13:
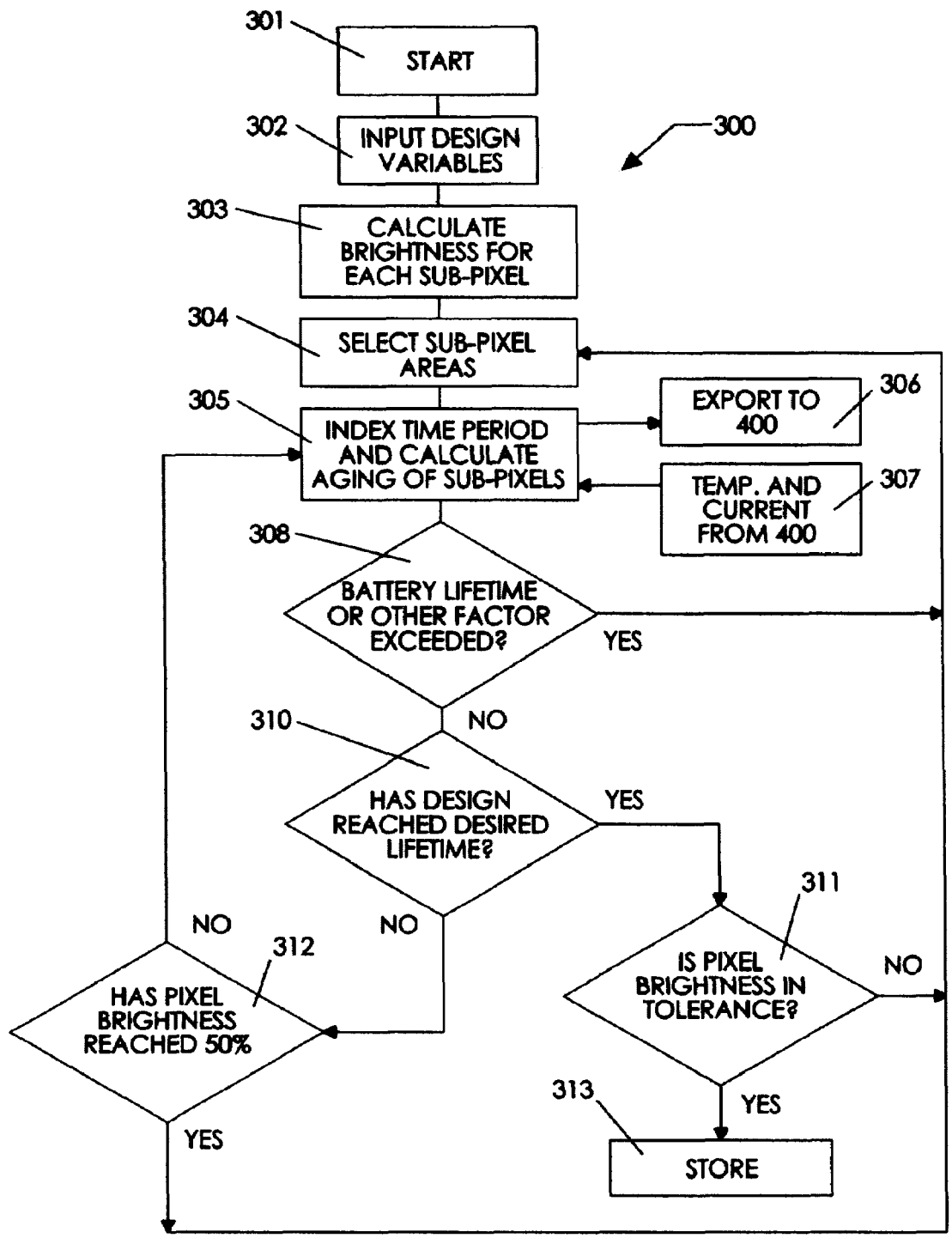
FIG. 13 shows an alternative embodiment of the flow diagram of FIG. 11.
Figure 14:
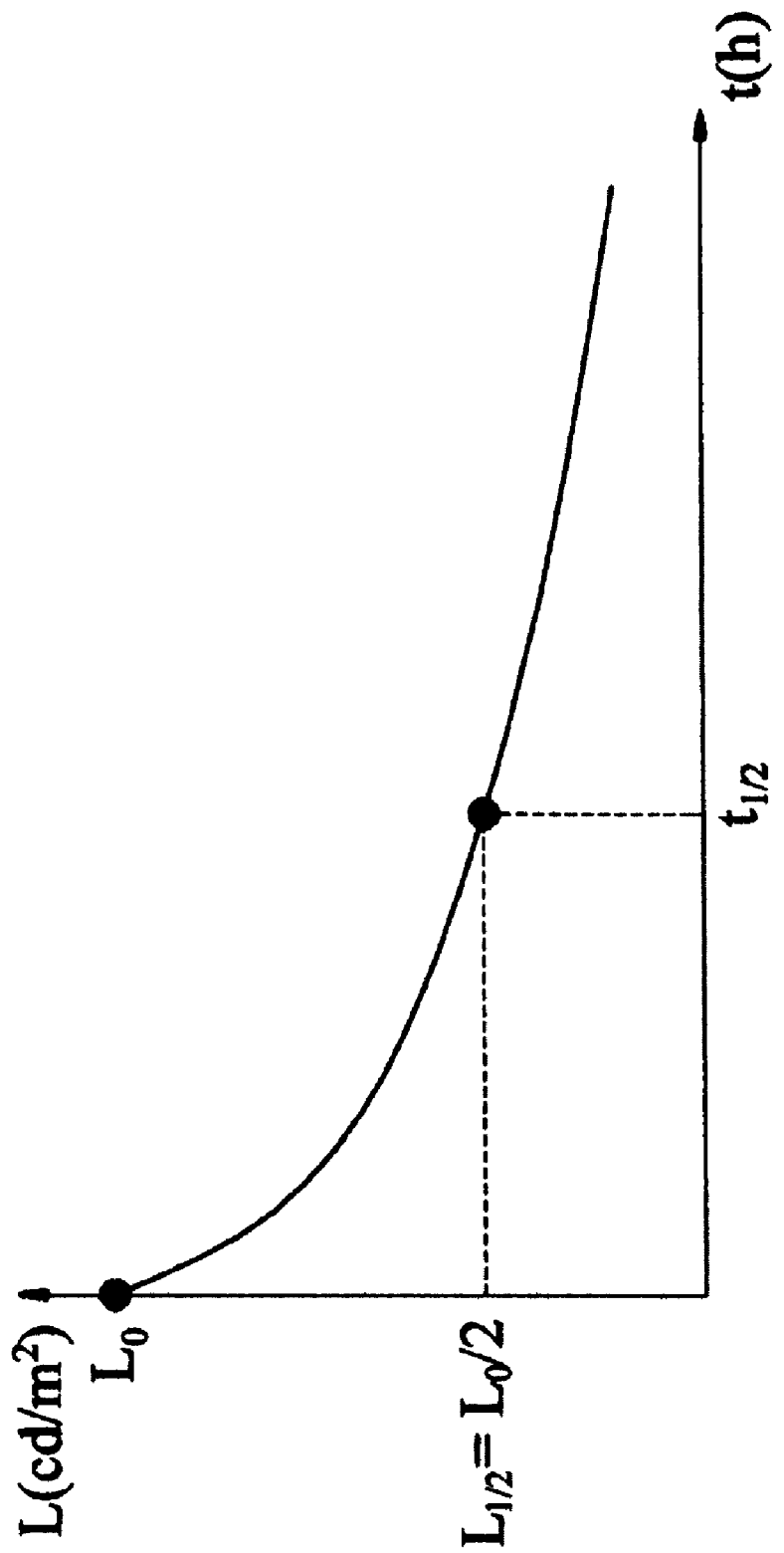
FIG. 14 shows light output decay over time for an OLED material.

Flow diagrams of optimization methods according to individual embodiments of the present invention are shown in FIGS. 8, to 13. The purpose of these methods is to determine sub-pixel areas such that each sub-pixel has a lifetime similar to that of the complete pixel itself. This means that all the sub-pixels should have approximately the same lifetime. Preferably, the lifetimes of the individual sub-pixel elements do not differ by more than 20%, more preferably by 10% or less from each other. Also these methods may optimize on other factors such as battery life, total energy consumption over life, instantaneous total heat output, etc.

A set of four equations and four variables need to be solved:

1. The I–V curve for the pixel sub-elements that is a mathematical relationship in the form:

$J = f_1(V)$

2. The relationship between current density and light output (usually modeled as a second order polynomial function to account for saturation phenomenon).

$J = f_2(L)$

3. An end of life criterion which expresses the relation between temperature and accumulated charge and thus also a relation between integrated current density over time versus operating temperature (Arrhenius equation or other ageing model):

$Q(T) = f_3(T)$

4. Temperature module which is a relationship between temperature and power or thus current (P=V.J.S=J.S.$f_1^{-1}$(J)):

$T = f_4(J)$

Mathematically, by choosing different boundary conditions, different optimizations can be obtained. For example, lifetime maximization and color difference minimization, power consumption minimization throughout the life of the display. Closer to the end of life of the display, the drive currents are increasing nearly asymptotically, and thus power consumption is increasing as the square of the current. These currents may be beyond what could be delivered by a battery on a handheld for a reasonable amount of time. Therefore, the present invention includes an optimization that seeks:

$$\min(\sum_{i=R,G,B} J_i * V_i * S_i)$$

$S_i$ is the area of each primary color element. By calculating the $S_i$ such that the power consumption near the end of life of the pixels is minimum two things can be assured:
- the power consumption of the display during the life of the display is minimum
- the battery will be dimensioned well and optimized (resulting in a cheaper battery, often the most expensive component next to the display in a handheld).

In FIG. 8 a main method 100 is shown in accordance with an embodiment of the present invention. It is assumed in this method that the driving current for each pixel element as well as the temperature of the display remains substantially constant over the lifetime of the display. In step 102 the design values for the display are entered, e.g. white point, brightness etc. as well as the temperature(s) to be used for the calculation of the aging effects on the pixel elements which is (are) entered in step 103 from algorithm 200. The algorithm 200 is described below. In step 106 the brightness for each sub-pixel element is determined, e.g. calculated, to provide the white point as well as to provide the design level of brightness for the complete pixel element. In step 107 the areas of the sub-pixels are selected. In step 108 the design is iterated one time period and the aging of the sub-pixels is determined, e.g. calculated. In step 109 it is determined whether a color shift has been introduced by the aging over a selected color gamut. For example, the number of JND color difference for each displayable color can be determined. Typically, there will be 256 colors which can be displayed. If NO in step 109, then other sub-pixel areas are selected in step 107, e.g. larger areas. If YES in step 109, it is determined in step 110, if the design has reached its intended lifetime. If NO in step 110, it is determined in step 112 whether a pixel brightness has reached a certain value, e.g. within a range 40–60%, especially 50%. If NO in step 112, the program returns to step 108 and the time is indexed one time period. If YES in step 112 the program returns to step 107 and the sub-pixel sizes are re-selected. If YES in step 110, it is determined in step 111 whether pixel brightness is within a predefined tolerance of a predefined end-value such as in the range 40–60%, especially 50%. If YES in step 111 the algorithm has determined a working solution and the results and the design may be stored in step 113 or the algorithm goes to 200 to determine the temperature and to re-optimize the design. If NO in step 111, then other sub-pixel areas are selected in step 107, e.g. smaller or larger areas depending on whether the final pixel brightness is above or below tolerance.

Figure 9:
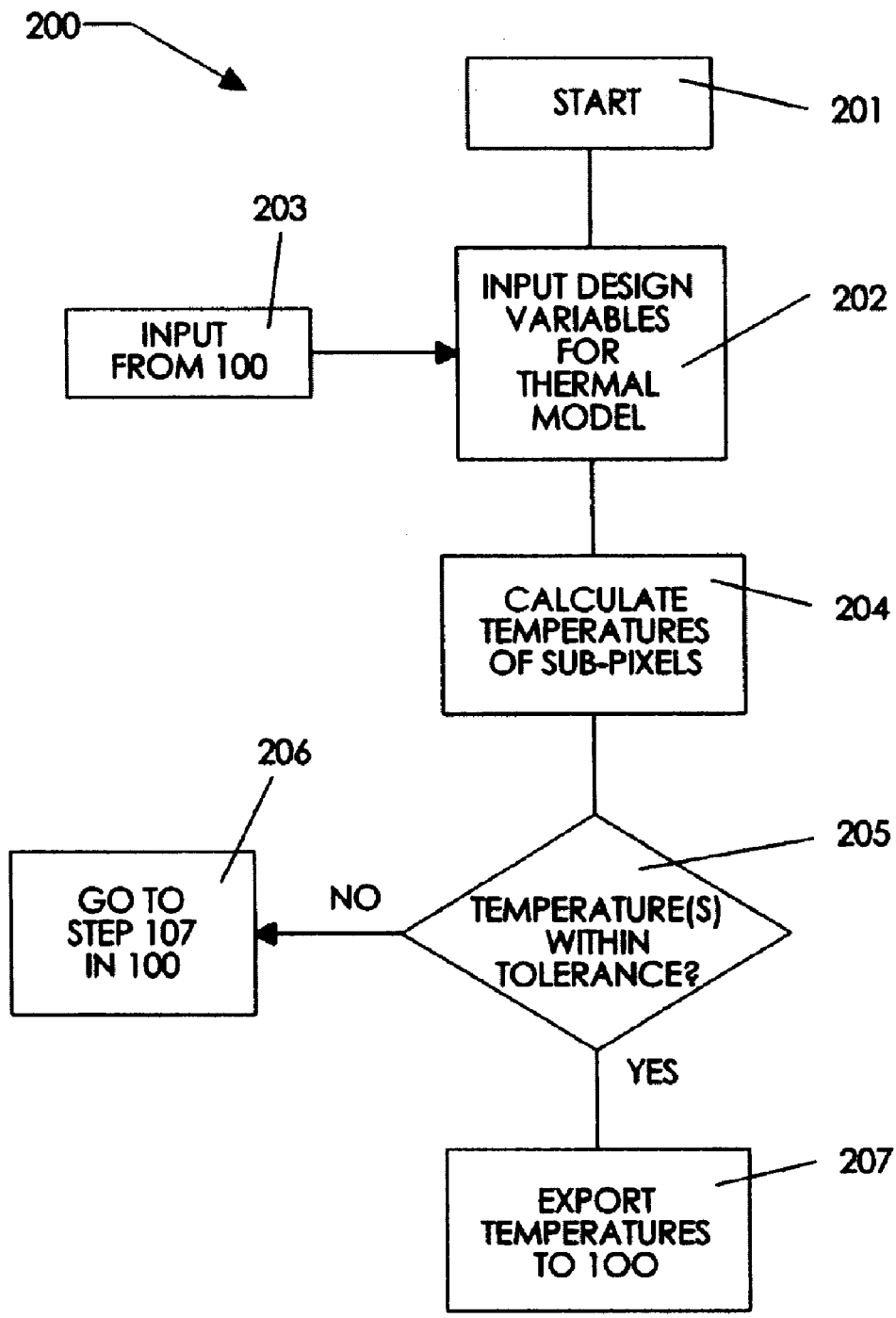
FIG. 9 shows a flow diagram of a further part of the optimization procedure according to FIG. 8

Turning to FIG. 9, method 200 starts with the input of the design values for the display in step 202 as well as the sub-pixel areas input initially or from step 111 in method 100. In step 204 the temperatures of the sub-pixels are determined, e.g. calculated. Optionally, in step 205 it is determined if these temperatures are less than an allowed temperature. If YES in step 205 these temperatures are exported to method 100 in step 207. If NO in step 205, then the selection of the areas is not acceptable and the algorithm 200 returns, in step 206, to step 107 for re-selection of sub-pixel areas. Step 205 may be skipped and the algorithm goes from step 204 to step 207. Returning to FIG. 8, the calculated temperatures are input in step 103. In step 104 it is determined if the new temperatures differ from the temperatures used in the previous iteration of method 100 by less than a tolerance value. If YES in step 104, the complete algorithm is finished and an optimized set of sub-pixel areas has been obtained. If NO in step 104, the method 100 continues with step 106.

Figure 10:
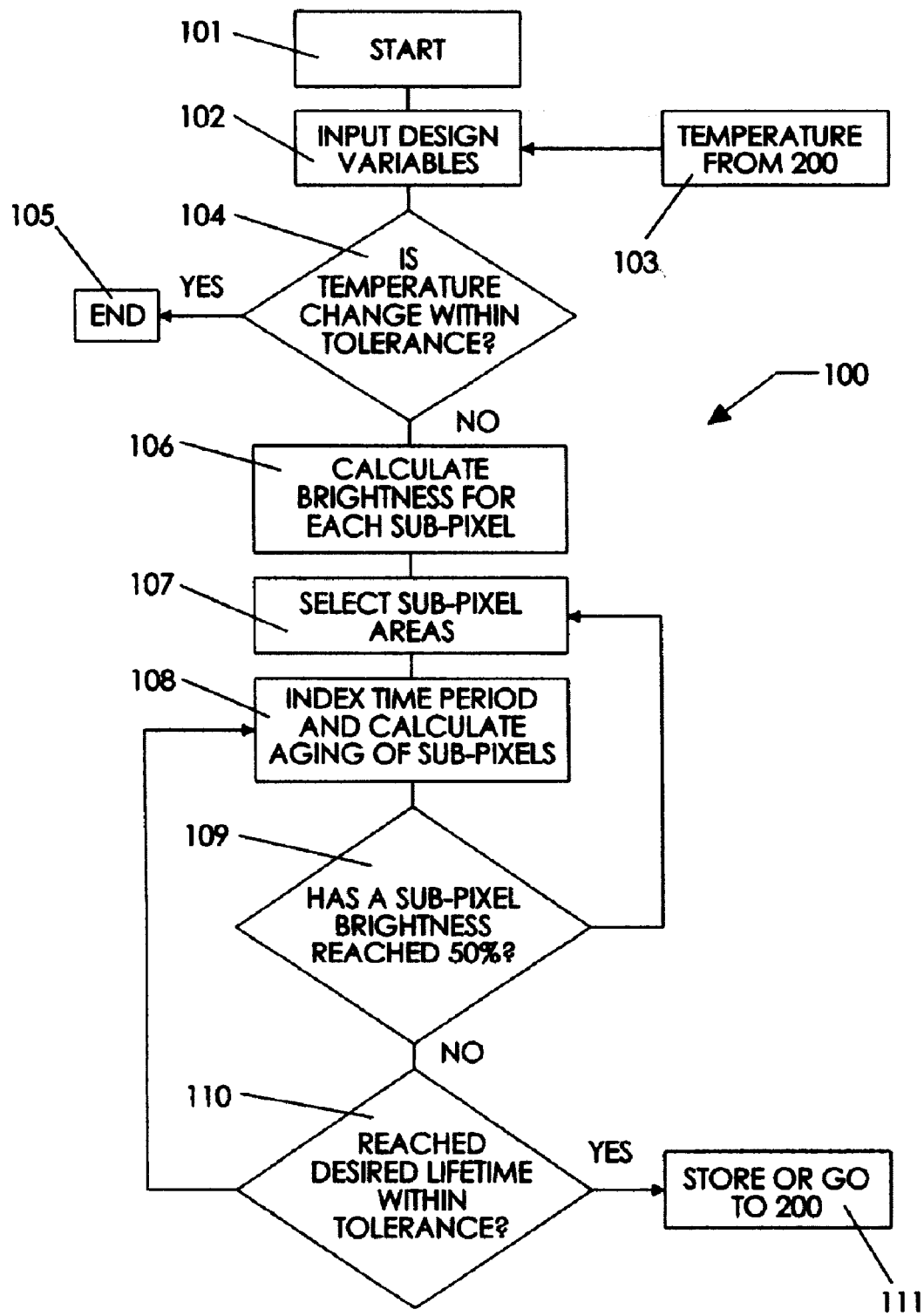
FIG. 10 shows an alternative embodiment of the flow diagram of FIG. 8.

An alternative embodiment of the present invention will be described with reference to FIG. 10. The method 100 of FIG. 10 has the same steps 101 to 108, and 111 of the method of FIG. 8. In step 109 it is determined if any sub-pixel has reached a predetermined reduction in luminosity compared to the initial condition, e.g. in the range 40–60%, especially 50%. If YES in step 109, then other sub-pixel areas are selected in step 107, e.g. larger areas. If NO in step 109, it is determined in step 110, if the design has reached its intended lifetime. If YES in step 110, the design may be stored and algorithm 200 is called. If NO in step 110 the program returns to step 108 and the time is indexed one time period.

Figure 11:
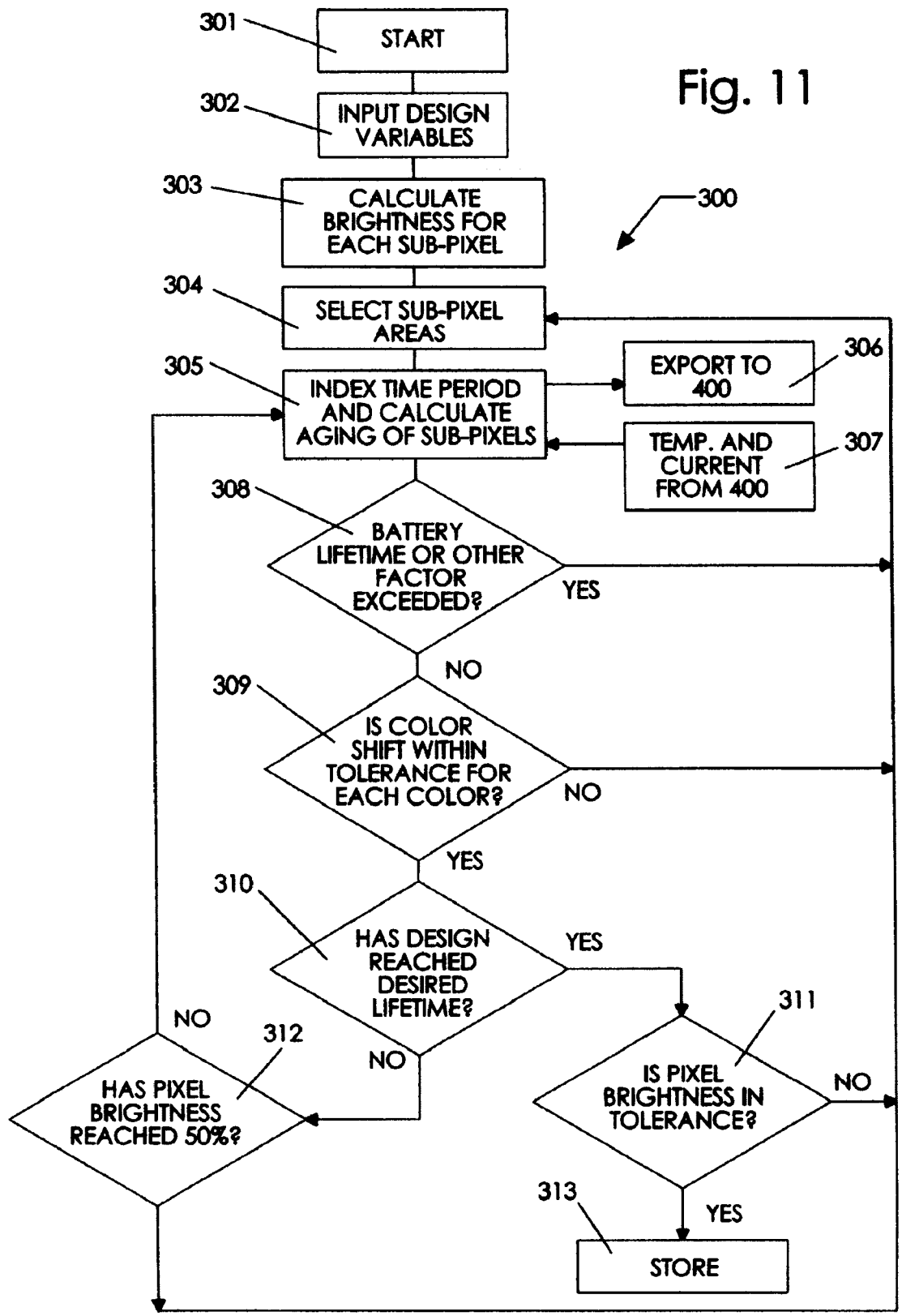
FIG. 11 shows a flow diagram of part of another optimization procedure in accordance with an embodiment of the present invention.

In FIG. 11 another main method 300 is shown in accordance with an embodiment of the present invention. Whereas in the above methods the driving current for each pixel element as well as the temperature of the display is assumed to remain substantially constant over the lifetime of the display, in this algorithm the current is allowed to change during the lifetime of the display which will also effect the temperature of the display. In step 302 the design values for the display are entered, e.g. white point, brightness etc. as well as the initial temperature(s) and current(s) to be used for the calculation of the aging effects on the pixel elements. In step 303 the brightness for each sub-pixel element is determined, e.g. calculated, to provide the white point as well as to provide the design level of brightness for the complete pixel element. In step 304 the areas of the sub-pixels are selected. In step 305 the design is iterated one time period and the aging of the sub-pixels is determined, e.g. calculated. To determine the temperature and the currents to be used for the next iteration step the sub-pixel areas and the pixel drive current(s) are exported to algorithm 400 in step 306 and calculated temperature(s) and current(s) are returned to step 305 in step 307. Step 308 is an optional step. The new currents returned in step 307 will affect battery life if the battery is run at these currents. Thus, for battery based devices, a new battery life can be calculated for the new currents. If the battery lifetime is less than an acceptable limit (i.e. YES in step 308) the algorithm returns to step 304 and new sub-pixel areas, e.g. bigger areas, are selected. Other factors may be used to select in this step. For example, the integrated consumed energy may be calculated. If this consumed energy is above a maximum limit, then a YES is returned in step 308. The total consumed energy provides a value for an aspect of the operating costs, that is electrical power used. Alternatively, the value of the currents returned in step 307 provide information as to the instantaneous heat emitted by the device. It may be desired to limit this amount of heat. In this case an upper limit may be placed on the currents returned in step 307. In this case if the current is above a certain limit a YES is returned in step 308. If NO in step 308 (for any of the reasons above) then in step 309 it is determined whether a color shift has been introduced by the aging over a selected color gamut. For example, the number of JND color difference for each displayable color can be determined. Typically, there will be 256 colors which can be displayed. If NO in step 309, then other sub-pixel areas are selected in step 304, e.g. larger areas. If YES in step 309, it is determined in step 310, if the design has reached its intended lifetime. If YES in step 310, it is determined in step 311 whether pixel brightness is within a predefined tolerance of a predefined end-value such as in the range 40–60%, especially 50%. If YES in step 311 the algorithm has determined a working solution and the results and the design may be stored in step 313. However, further design variations may be made, i.e. a further optimization may be attempted. If NO in step 311, then other sub-pixel areas are selected in step 304, e.g. smaller or larger areas depending on whether the final pixel brightness is above or below tolerance. If NO in step 310, it is determined in step 312 whether a pixel brightness has reached a certain value, e.g. within the range 40–60%, especially 50%. If NO in step 312, the program returns to step 305 and the time is indexed one time period. If YES in step 312 the program returns to step 304 and the sub-pixel sizes are re-selected.

Figure 12:
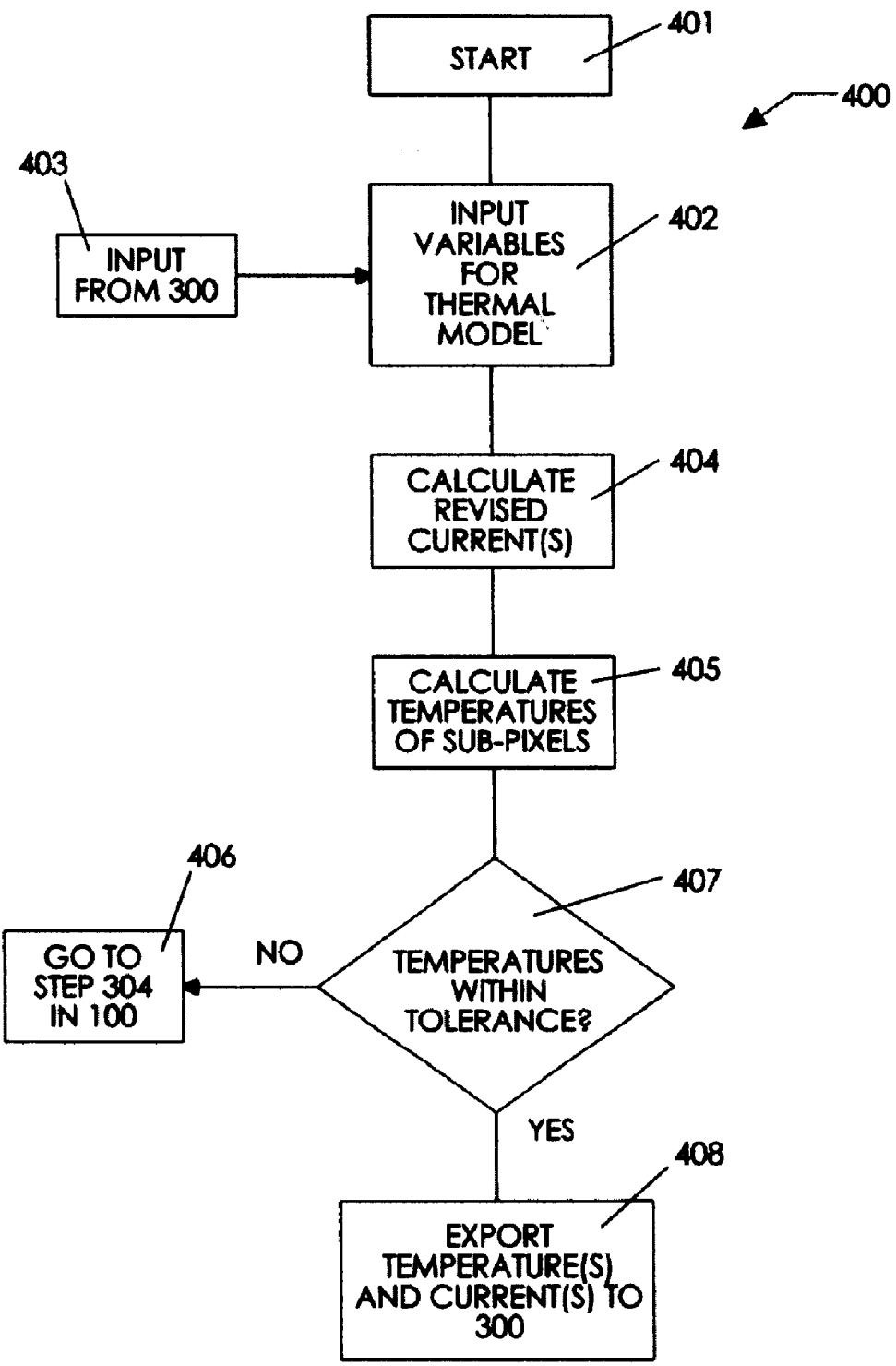
FIG. 12 shows a flow diagram of a further part of the optimization procedure according to FIG. 11.

Turning to FIG. 12, method 400 starts with the input of the design values for the display in step 402 as well as the currents and sub-pixel areas input initially or from step 305 in method 300. In step 404 the new current required to compensate at least partly for the pixel element degradation is calculated. This calculation does not need to compensate perfectly for the loss of brightness but rather can reduce the loss of brightness by a certain degree. In step 405 the temperatures of the sub-pixels are determined, e.g. calculated, based on the revised current(s). Optionally, in step 406 it is determined if these temperatures are less than an allowed temperature. If YES in step 406 these temperatures as well as the revised current(s) are exported to method 300 in step 408. If NO in step 406, then the selection of the areas is not acceptable and the algorithm 400 returns, in step 407, to step 304 for re-selection of sub-pixel areas. If step 406 is skipped the algorithm goes from step 405 to step 408.

An alternative to the method 300 of FIG. 11 is shown in FIG. 13. Due to the similarity between FIG. 11 and FIG. 13 it will not be described in detail. In the method 300 of FIG. 13 step 309 has been omitted. Instead the deciding criteria is whether the pixels have reached a certain value of brightness, e.g. a reduction to within a range 40–60%, especially 50% of the starting value (steps 311 and 312).

The methods of FIGS. 8 to 13 have been described with reference to starting at time zero and working towards the end point of usefulness of the device. However, the present invention also includes other optimization methods. For instance the methods 100, 200, 300, 400 may be operated in the reverse direction. That is, the end point is the starting point. The final design values are decided, e.g. within a range 40–60% or 50% light output from the pixels, a certain pixel drive current, certain areas of pixel sub-elements, color shift larger than a predetermined value. Then the methods work backwards towards time zero. For instance, the method 400 calculates the reduction in degradation and temperature and the reduction in current which can be tolerated in each iteration step. The end point is reached when 100% brightness has been achieved for the selected areas of the pixel sub-elements. This then gives a total lifetime that can be compared with the desired lifetime. Alternatively, a complete solution of the equations can be carried out. In this case the defining equations are solved simultaneously, rather than in an iterative manner as described above.

The above methods may be implemented on a computer such as a UNIX workstation or a personal computer running an operating system such as Windows™, supplied by Mircrosoft Corp., USA, each of these having a processor and memory. The methods may be implemented as software programs, e.g. written in the C language and then compiled for the relevant microprocessor.

For the above methods to be implemented reliable L–I–V data is required for each emitter material in order to calculate the heat generated in each pixel element. Such reliable data is especially needed close to the estimated operation conditions in order to have the best possible lifetime estimation and balancing. It also requires a good understanding of the thermal behavior of the display since the temperature is an important determinant for lifetime.

In the final step, a display is constructed in accordance with the areas of the sub-pixel elements determined by the above methods.

In accordance with the present invention, each primary pixel element of a display can be run independently and the luminous efficiency (cd/A) determined. Based on this data and a lifetime model such as one of the lifetime models presented above, it is possible to determine the optimized areas for use in the display. Furthermore, this optimization cannot be obtained by any other construction, drive technique or software. One target brightness and the characteristics of each emitter determine uniquely the area proportions for a certain geometrical size of a pixel.

To determine if the optimization has been carried out correctly the following tests may be done. The display comprising an array of pixel elements or a single element is run at its maximum brightness settings for a full white image, in the highest allowable environmental conditions (e.g. humidity/temperature). There will be noticeable decay of the emitter efficiency after a limited time of operation. The luminous efficiency is measured at time zero and after a certain period of time which depends on the lifetime of the display, e.g. 1000 hrs of full white operation as described above. From the measured data, the time to half brightness of each color can be determined. In accordance with the present invention the lifetimes of the various color elements of a pixel can be brought to within 10% of each other. It is not necessarily the case that unequal size emitters provide optimized lifetime or brightness. However, the above method of calculation delivers a method to determine for a display whether any optimization of brightness and lifetime was done correctly.

Figure 15:
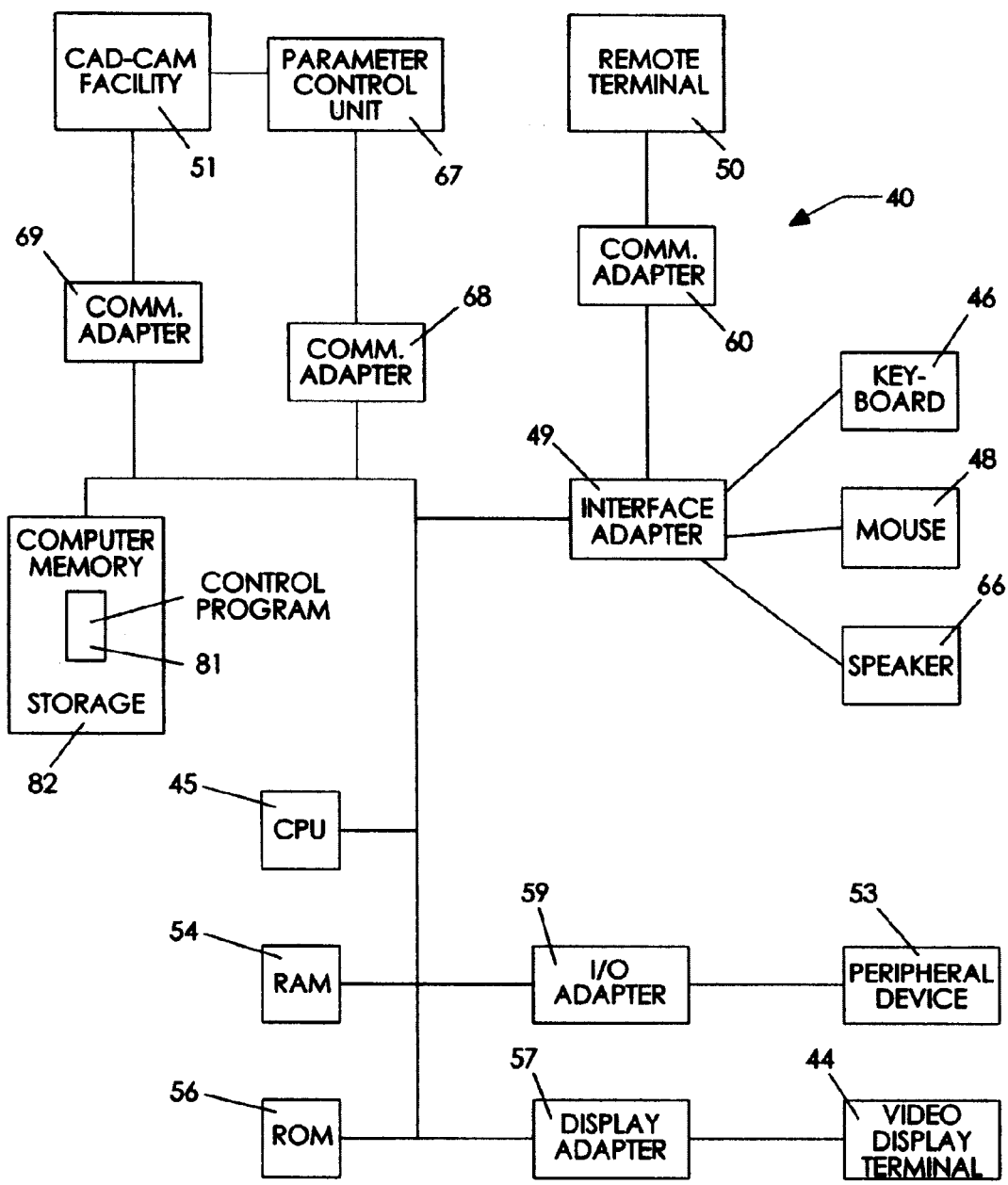
FIG. 15 shows a computer system which may be used with methods of the present invention.

FIG. 15 is a schematic representation of a computing system that can be utilized with the methods and in a system according to the present invention. A computer 40 is depicted which may include a video display terminal 44, a data input means such as a keyboard 46, and a graphic user interface indicating means such as a mouse 48. Computer 40 may be implemented as a general purpose computer, e.g. a UNIX workstation, a laptop, a desktop computer.

Computer 40 includes a Central Processing Unit ("CPU") 45, such as a conventional microprocessor of which a Pentium IV processor supplied by Intel Corp. USA is only an example, and a number of other units interconnected via system bus 52. The computer 40 includes at least one memory. Memory may include any of a variety of data storage devices known to the skilled person such as random-access memory ("RAM"), read-only memory ("ROM"), non-volatile read/write memory such as a hard disc as known to the skilled person. For example, computer 40 may further include random-access memory ("RAM") 54, read-only memory ("ROM") 56, as well as an optional display adapter 57 for connecting system bus 52 to an optional video display terminal 44, and an optional input/output (I/O) adapter 59 for connecting peripheral devices (e.g., disk and tape drives 53) to system bus 52. Video display terminal 44 can be the visual output of computer 40, which can be any suitable display device such as a CRT-based video display well-known in the art of computer hardware. However, with a portable or notebook-based computer, video display terminal 44 can be replaced with a LCD-based or a gas plasma-based flat-panel display. Computer 40 further includes user interface adapter 49 for connecting a keyboard 46, mouse 48, optional speaker 66, as well as a data network connection to a remote terminal 50 via a communication adapter 60, e.g. via the Internet, an Intranet a Local or Wide Area network (LAN or WAN) or a CAN. At the terminal 50 a description of values relating to a display in accordance with the present invention may be entered at the near location 51 and transmitted to a remote location such as computer 40, e.g. via the Internet, where a processor carries out a method in accordance with the present invention and returns a parameter relating to the physical system to the near location.

A CAD-CAM facility 51 may also connected to bus 52 via a communication adapter 69 connecting computer 40 via a data network such as the Internet, an Intranet a Local or Wide Area network (LAN or WAN) or a CAN. The CAD/CAM facility 51 operates to produce display devices in accordance with physical design values or data relevant to the manufacture of a display in accordance with the present invention transmitted over a telecommunications network.

A parameter control unit 67 for facility 51 may also be connected via a communications adapter 68. Parameter control unit 67 may receive an output value from computer 40 running a computer program for design of a display in accordance with the present invention or a value representing or derived from such an output value and may be adapted to alter a parameter of the CAD/CAM facility 51 in response to receipt of the output value from computer 40. For example, the dimension of one element of a semiconductor display device may be altered based on the output, e.g. the dimension of a light emitting sub-element of a pixel structure, a material may be changed, e.g. a connection may be changed from aluminium to copper, or a material may be modified, e.g. a different doping level in a semiconductor layer, based on the output.

Those skilled in the art will appreciate that the hardware represented in FIG. 15 may vary for specific applications. For example, other peripheral devices such as optical disk media, audio adapters, or chip programming devices, such as PAL or EPROM programming devices well-known in the art of computer hardware, and the like may be utilized in addition to or in place of the hardware already described.

Computer 40 also includes a graphical user interface that resides within machine-readable media to direct the operation of computer 40. Any suitable machine-readable media may retain the graphical user interface, such as a random access memory (RAM) 54, a read-only memory (ROM) 56, a magnetic diskette, magnetic tape, or optical disk (the last three being located in disk and tape drives 53). Any suitable operating system and associated graphical user interface (e.g., Microsoft Windows) may direct CPU 45. In addition, computer 40 includes a control program 81 which resides within computer memory storage 82. Control program 81 contains instructions that when executed on CPU 45 can carry out or support the operations described with respect to any of the methods of the present invention. Accordingly, the present invention includes software, i.e. a computer program product, which contains code which can execute on a computing system to perform any of the methods according to the invention.

The present invention includes a computer program product comprising software, the software having code for selecting areas of at least two sub-pixel elements of a display and modifying the areas of the at least two sub-pixel elements to optimize a lifetime of one or more elements of the display when the code is executed on a computing device. The computer product comprises code which, when executed, can determine the sub-pixel areas such that that each pixel element displays white at a predetermined white point within a certain tolerance. When the code is executed, the lifetimes of the sub-pixel elements may be optimized to within a predetermined tolerance of each other. The code, when executed, may optimize the sub-pixel areas so that each pixel element displays white at a predetermined white point within a certain tolerance over the lifetime of the pixel element. The code, when executed, may determine the lifetime of the pixel element by the estimated brightness of the pixel element reducing to a predetermined value such as within a range 40–60% or 50% of its initial value. The code, when executed, may determine the lifetime of the pixel element by an estimated color shift of the pixel element greater than a predetermined value. The code, when executed, may determine the lifetime of a sub-pixel element by the estimated brightness of the sub-pixel element reducing to a predetermined value such as within a range 40–60% or 50% of its initial value. The code, when executed, may determine the lifetime of a sub-pixel element in accordance with an estimated color shift of the sub-pixel element greater than a predetermined value. The predetermined value may be a number of JND's, e.g. 3. Typically, there are at least three sub-pixels for each pixel element and the code, when executed, optimizes areas of the at least three sub-pixel elements such that the lifetimes of the sub-pixel areas are within a predetermined tolerance of each other. This predetermined tolerance may be 20%, more preferably 10%. The code when executed may consume data relating to the display, in particular performance data for pixel elements which are organic light emitting diodes. The code, when executed may calculate a temperature of each sub-pixel element when each pixel element displays white at the predetermined white point, and may calculate an aging effect on each sub-pixel element based on the calculated temperature. When the display is powered by a battery, the display element to be optimized may be the battery, and the code, when executed, may optimize the sub-pixel areas to optimize the battery lifetime between charging over the lifetime of the pixel elements.

In the example depicted in FIG. 15, the computer program product can reside in computer storage, e.g. any of the memories mentioned above. However, it is important that while the present invention has been, and will continue to be, that those skilled in the art will appreciate that the mechanisms of the present invention are capable of being distributed as a program product in a variety of forms, and that the present invention applies equally regardless of the particular type of signal bearing media used to actually carry out the distribution. Examples of computer readable signal bearing media include: recordable type media such as floppy disks and CD ROMs and transmission type media such as digital and analogue communication links.

The above description discloses several methods and materials of the present invention. This invention is susceptible to modifications in the methods and materials, as well as alterations in the fabrication methods and equipment.

Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

The invention claimed is:

1. A fixed format emissive display comprising: an array of emissive pixel elements, each pixel element comprising at least two sub-pixel elements made of different materials; and areas of the at least two sub-pixel elements being such that lifetimes of the sub-pixel areas are within a predetermined tolerance of each other,
   wherein each pixel element displays white at a predetermined white point within a certain tolerance over a lifetime of the pixel element and
   wherein the lifetime of the pixel element is determined by a color shift of the pixel element greater than a predetermined value.

2. The fixed format emissive display according to claim 1, wherein the lifetime of the pixel element is determined by the brightness of the pixel element reducing to a predetermined value compared with an initial value, preferably within the range 40–60%.

3. The fixed format emissive display according to claim 1, wherein the lifetime of a sub-pixel element is determined by the brightness of the sub-pixel element reducing to a predetermined value compared with an initial value, preferably within the range 40–60%.

4. The fixed format emissive display according to claim 1, wherein the lifetime of a sub-pixel element is determined by a color shift of the sub-pixel element greater than a predetermined value.

5. The fixed format emissive display according to claim 1, wherein the predetermined value is a number of JND's.

6. The fixed format emissive display according to claim 5, wherein the number of JND's is 3.

7. The fixed format emissive display according to claim 1 wherein there are at least three sub-pixels for each pixel element and areas of the at least three sub-pixel elements are such that the lifetimes of the sub-pixel areas are within a predetermined tolerance of each other.

8. The fixed format emissive display according to claim 1; wherein the predetermined tolerance is 20%, more preferably 10%.

9. The fixed format emissive display according to claim 1, wherein the pixel elements are organic light emitting diodes.

10. A method of designing a fixed format emissive display using a computing device having a processor and a memory, the display comprising an array of emissive pixel elements, each pixel element comprising at least two sub-pixel elements made of different materials; the method comprising: selecting areas of the at least two sub-pixel elements so that each pixel element displays white at a predetermined white point within a certain tolerance, and modifying the areas of the at least two sub-pixel elements to optimize a lifetime of one or more elements of the display, and
   wherein the lifetime of the pixel element is determined by an estimated color shift of the pixel element greater than a predetermined value.

11. The method according to claim 10, wherein display elements to be optimzed are the sub-pixel elements and the lifetimes of the sub-pixel elements are optimized to within a predetermined tolerance of each other.

12. The method according to claim 11, wherein the lifetime of a sub-pixel element is determined by the estimated brightness of the sub-pixel element reducing to a predetermined value compared with an initial value, preferably within the range 40–60%.

13. The method according to claim 11, wherein the lifetime of a sub-pixel element is determined by an estimated color shift of the sub-pixel element greater than a predetermined value.

14. The method according to claim 10, wherein the display elements to be optimized are the sub-pixel elements and the sub-pixel areas are optimized so that each pixel element displays white at a predetermined white point within a certain tolerance over the lifetime of the pixel element.

15. The method according to claim 14, wherein the lifetime of the pixel element is determined by the estimated brightness of the pixel element reducing to a predetermined value compared with an initial value, preferably within the range 40–60%.

16. The method according to claim 10, wherein the predetermined value is a number of JND's.

17. The method according to claim 16, wherein the number of JND's is 3.

18. The method according to claim 10, wherein there are at least three sub-pixels for each pixel element and areas of the at least three sub-pixel elements are optimized such that the lifetimes of the sub-pixel areas are within a predetermined tolerance of each other.

19. The method according to claim 10; wherein the predetermined tolerance is 20%, more preferably 10%.

20. The method according to claim 10, wherein the pixel elements are organic light emitting diodes.

21. The method according to claim 10, further comprising: calculation of a temperature of each sub-pixel element when each pixel element displays white at the predetermined white point, and calculating an aging effect on each sub-pixel element based on the calculated temperature.

22. The method according to claim 10, wherein the display is powered by a battery and the display element to be optimized is the battery, wherein the sub-pixel areas are optimized to optimize an estimated battery lifetime between charging over the lifetime of the pixel elements.

23. A computer program product comprising software, the software having code for, when the code is executed on a computing device, selecting areas of at least two sub-pixel elements of a display and modifying the areas of the at least two sub-pixel elements to optimize a lifetime of one or more elements of the display whereby the lifetime of the elements is determined by an estimated color shift of the elements greater than a predetermined value.

* * * * *